US008482013B2

(12) United States Patent
Chai et al.

(10) Patent No.: US 8,482,013 B2
(45) Date of Patent: Jul. 9, 2013

(54) RECONFIGURABLE MULTI-LED LIGHT SOURCE

(75) Inventors: Yan Chai, Livermore, CA (US); Calvin B. Ward, Castro Valley, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 13/253,865

(22) Filed: Oct. 5, 2011

(65) Prior Publication Data

US 2013/0088160 A1 Apr. 11, 2013

(51) Int. Cl.
*H01L 27/15* (2006.01)
*F21S 4/00* (2006.01)

(52) U.S. Cl.
USPC ........................................ 257/83; 362/249.13

(58) Field of Classification Search
USPC .......... 315/291, 224, 307, 312, 185 R, 185 S, 315/209 R; 257/80, 83, 84; 362/227, 249.01, 362/249.02, 249.08, 249.12, 249.13
See application file for complete search history.

(56) References Cited

U.S. PATENT DOCUMENTS

| | | | | |
|---|---|---|---|---|
| 6,633,322 B2 * | 10/2003 | Sakai et al. | .................. | 347/233 |
| 7,337,089 B2 * | 2/2008 | Yang et al. | .................. | 702/182 |
| 7,843,150 B2 * | 11/2010 | Wang et al. | .................. | 315/307 |
| 7,884,558 B2 * | 2/2011 | Steele et al. | .................. | 315/312 |

* cited by examiner

*Primary Examiner* — Minh D A
(74) *Attorney, Agent, or Firm* — Calvin B. Ward

(57) ABSTRACT

A light having a plurality of LEDs and a switching substrate is disclosed. The switching substrate is coupled to LEDs and includes a plurality of switches that provide a plurality of configurations for the LEDs. Each configuration is characterized by a two-dimensional array of LEDs having a minimum bias potential and a maximum bias potential, the LED array generating light when a bias potential is provided between the power terminals that is greater than the minimum bias potential, at least two configurations being operable to provide light at bias potential within this range. The switching substrate is sub-dividable into a plurality of identical multi-LED light sources by dividing the switching substrate along predetermined lines. The array of LEDs can be organized as a nested array of LEDs. The switches can be implemented as passive switches that are set by removing portions of conductors or bridging gaps in conductors.

10 Claims, 15 Drawing Sheets

RECONFIGURABLE MULTI-LED LIGHT SOURCE

BACKGROUND OF THE INVENTION

Light-emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

Most light sources that are candidates for replacement by LEDs require a plurality of LED dies to provide sufficient light to match the light output of the device being replaced. A replacement light source typically includes a plurality of LED dies, a power supply that converts AC power to DC power and some form of wiring matrix that contacts the plurality of dies in a parallel or serial configuration to the DC power source.

Initial cost and electrical conversion efficiency, and replacement costs are important factors in the design of such a replacement light source. The initial cost depends on the packaging costs inherent in connecting a large number of dies to a substrate and to the power supply. These costs are a significant fraction of the initial cost of an LED replacement for a conventional light source. The initial cost of the light source also depends on the degree to which the manufacturer of the light source must build each configuration from scratch by connecting individual LEDs to a substrate and controller that are particular to that configuration. There are a large number of light source configurations that must be produced to compete with conventional lighting technology. Each configuration is characterized by a total light output and a generated light spectrum. Even for "white" light sources, there is a range of "color temperatures" that typically vary from cool white to warm white. Other useful configurations provide the ability to dim the light source or change its color temperature after installation to vary the "mood" of the space being illuminated.

The long-term costs associated with the light source depend on the electrical conversion efficiency, the lifetime of the light source, and the cost of the replacement of the light source. LEDs have lifetimes that are significantly greater than those of conventional light sources. Hence, a light source based on LEDs has the potential of outlasting conventional light sources, and hence, reducing the cost of replacement. In many applications, the cost of replacement is many times the cost of the light source. While individual LEDs have very long lifetimes, a light source having tens of LEDs that are connected to a substrate and other components, has a significantly shorter time to failure. Hence, a high reliability light source must provide some mechanism for continued operation even when one or more of the LEDs or the connections thereto fail.

The electrical conversion efficiency depends on both the temperature and the amount of current that is driven through the LEDs. An LED can be modeled as a resistor in series with an ideal diode. The light output from the diode increases with increasing current; however, the power dissipated in the resistor increases as the square of the current. Hence, as the current increases, a greater fraction of the energy is dissipated as heat. As the temperature of the LED increases, the efficiency and lifetime of the LED decreases. As a result, a light source having a large number of smaller LEDs provides better efficiency than a light source having a fewer number of LEDs that are driven at higher currents. However, the increased number of LEDs also increases the packaging costs and the probability of failure due to one of the LEDs or its connections failing.

SUMMARY OF THE INVENTION

The present invention includes a light having a plurality of LEDs and a switching substrate. The switching substrate is coupled to LEDs and includes a plurality of switches that provide a plurality of configurations for the LEDs. Each configuration is characterized by a two-dimensional array of LEDs having a minimum bias potential and a maximum bias potential, the LED array generating light when a bias potential is provided between first and second power terminals is greater than the minimum bias potential. At least two of the configurations are operable to provide light at a bias potential between the minimum and maximum bias potentials. The switching substrate is sub-dividable into a plurality of identical multi-LED light sources by dividing the switching substrate along predetermined lines. The array of LEDs can be organized as a nested array of LEDs. The switches can be implemented as active switches such as transistors or as passive switches that are set by removing portions of conductors or bridging gaps in conductors.

DETAILED DESCRIPTION OF THE PREFERRED EMBODIMENTS OF THE INVENTION

Figure 1:
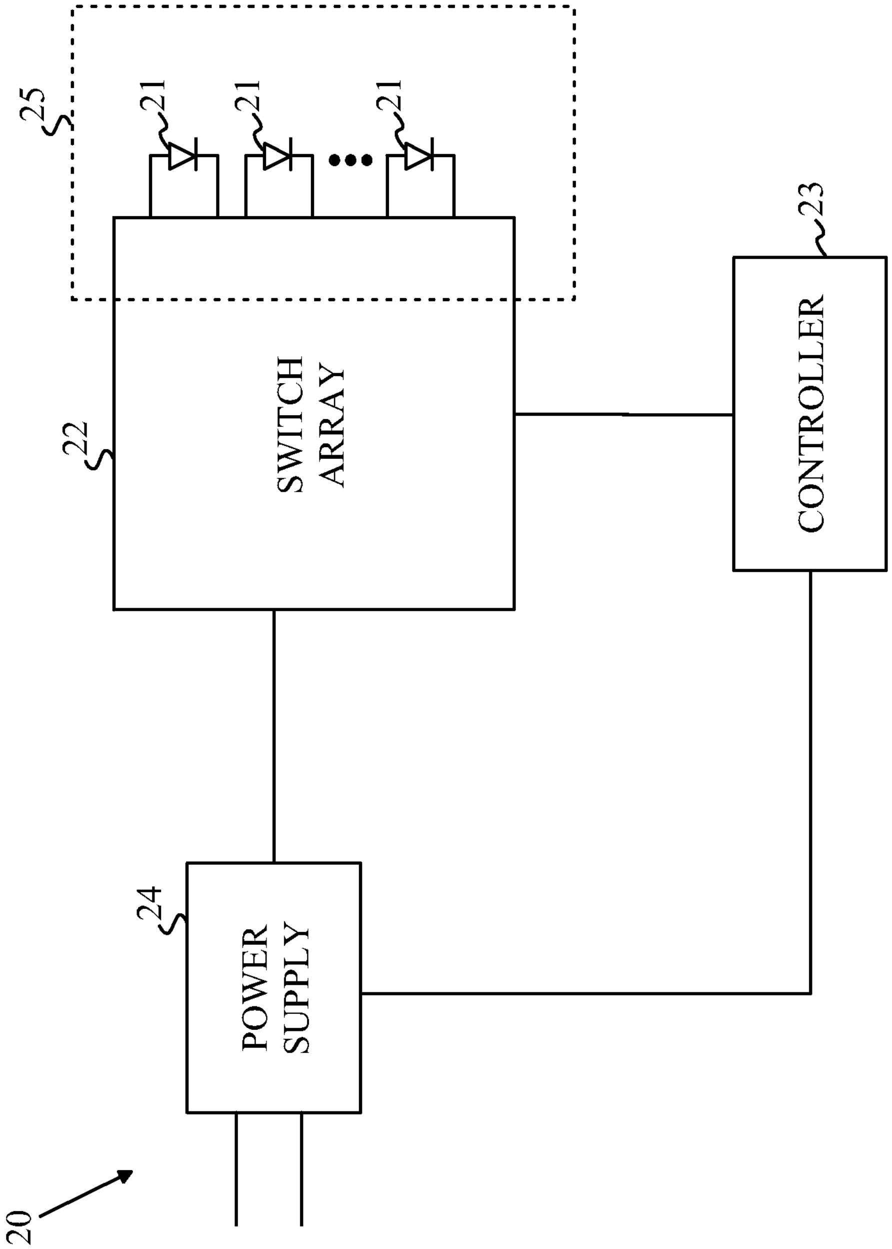
FIG. 1 illustrates one embodiment of a light source according to the present invention.
Figure 2C:
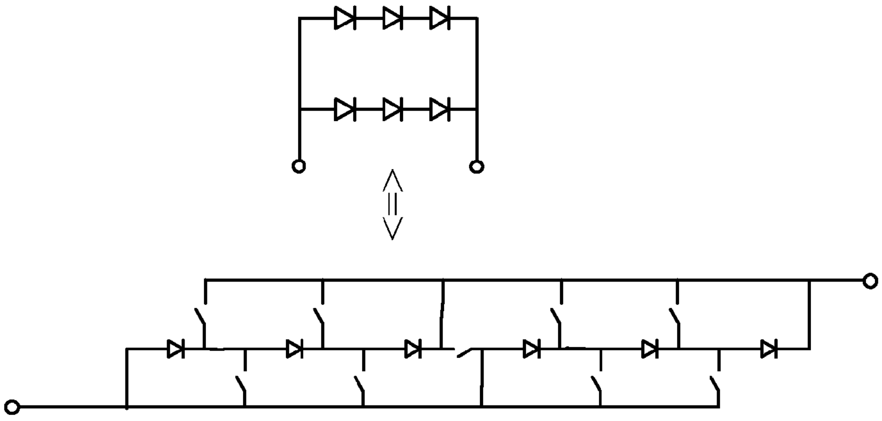
FIGS. 2 (*a*)-2(*e*) illustrate one embodiment of a six-LED light source that includes a switching array for reconfiguring the six LEDs into various parallel and series combinations.
Figure 2B:
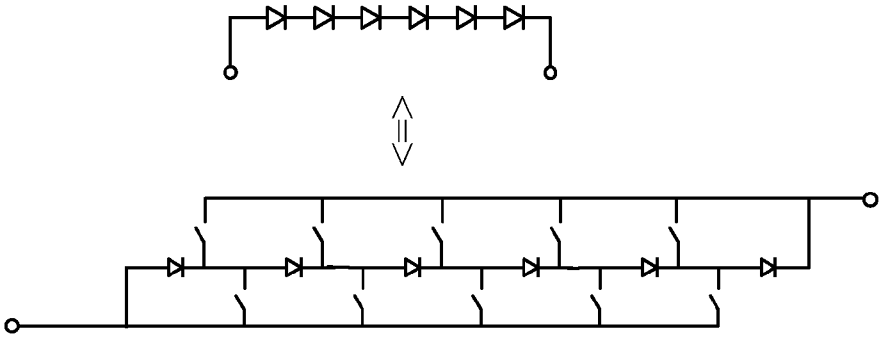
Figure 2A:
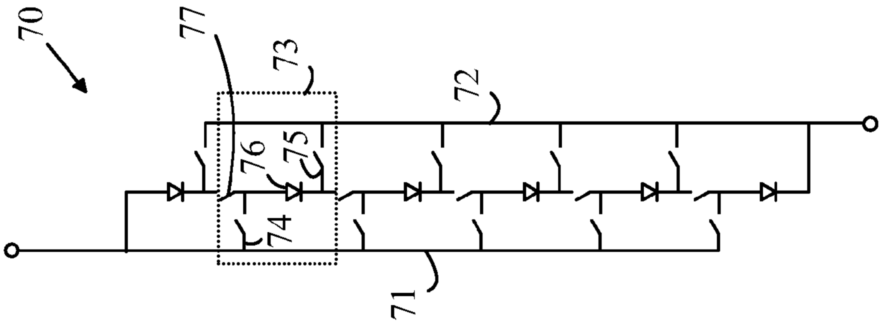
Figure 2E:
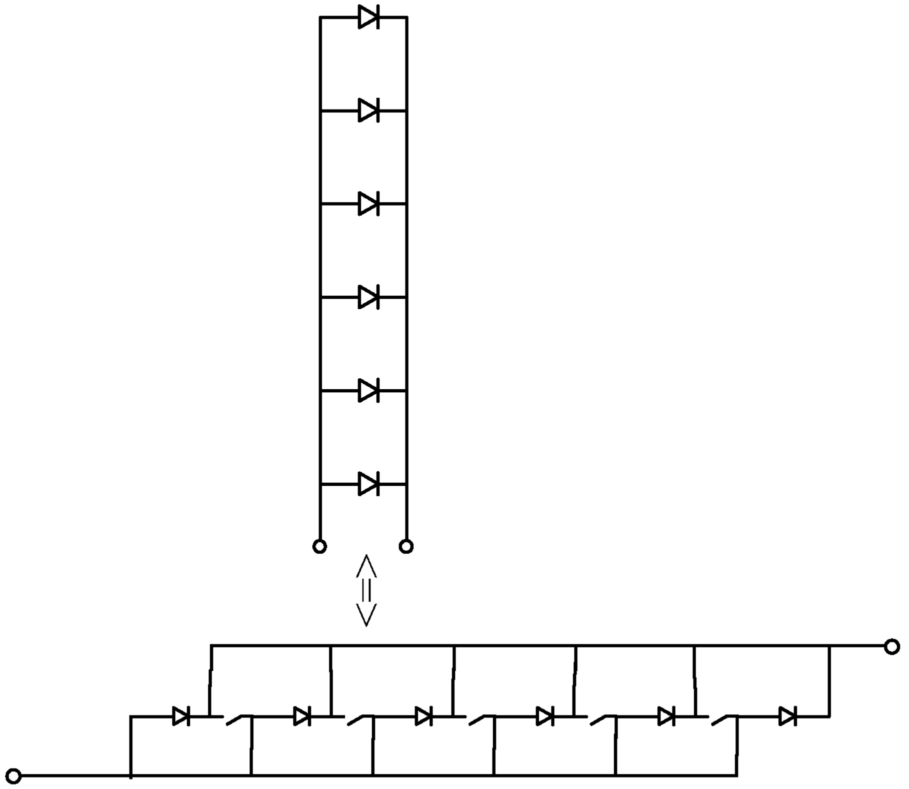
Figure 2D:
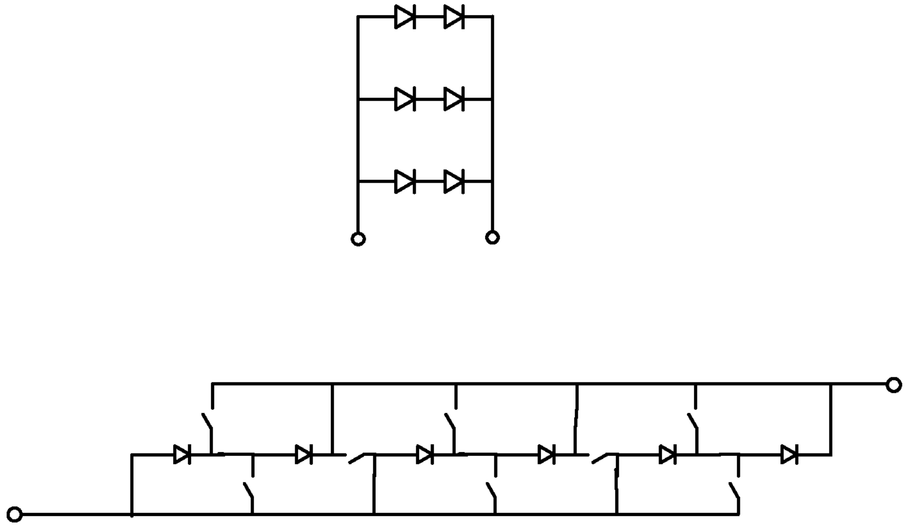

A light source according to one embodiment of the present invention includes an array of LED dies that are bonded to a substrate that includes a switching network that can be used to arrange the LEDs in various connection arrangements. Refer now to FIG. 1, which illustrates one embodiment of a light source according to the present invention. Light source 20 includes an LED array 25 having a plurality of LEDs 21 connected to a switching array 22. As will be explained in more detail below, in some embodiments an optional controller 23 configures the switches so as to arrange the LEDs in one of a plurality of different circuit configurations during the operation of the light source. The LEDs are driven from a power supply 24. The details of the switching system will be discussed in more detail below.

To simplify the following discussion, it will be assumed that all of the LEDs are identical. Each LED is characterized by two voltages. The first voltage, $V_f$, is the forward voltage that must be connected across the LED to cause the LED to begin to generate light. The second voltage, $V_d$, is the maximum voltage that can be connected across the LED without significantly shortening the lifetime of the LED. For GaN based LEDs, $V_f$ is approximately 2.75 V. $V_d$ depends on the desired lifetime of the LED; however, a reasonable value for $V_d$ is 3.5 V.

For any given configuration of the LEDs, the array can be viewed as a single LED with a minimum voltage, $V_{min}$, below which light will not be generated and a maximum voltage, $V_{max}$, that must not be exceeded. The output light intensity for any given configuration is approximately proportional to the number of LEDs that are generating light in that configuration. If the array were configured to be N LEDs in series, $V_{min}=NV_f$, and $V_{max}=NV_d$. If the array were configured as N LEDs in parallel, $V_{min}=V_f$, and $V_{max}=V_a$. In general, each possible configuration of the array can be characterized by the number of LEDs that are in series between the power terminals of the array. Ideally, for an array of identical LEDs, the array can at best be capable to be configured such that $V_{min}$ changes in increments of $V_f$ from $V_f$ through $NV_f$. However, not all such configuration are typically needed.

The manner in which an array of LEDs can be arranged in different configurations using a switching array can be more easily understood with reference to FIGS. 2(*a*)-2(*e*), which illustrate one embodiment of a six-LED light source that includes a switching array for reconfiguring the six LEDs into various parallel and series combinations. Referring to FIG. 2(*a*), LED array 70 is constructed from a plurality of LED sections, including a first section, a number of intermediary sections and a last section. An exemplary intermediate section is shown at 73. Section 73 includes an LED 76 and three switches. Switch 74 connects the anode of LED 76 to a first power rail 71. Switch 75 connects the cathode of LED 76 to a second power rail 72. Switch 77 connects the anode of LED 75 such that section 73 can be connected in series to the section above it in the sub-array. The first section lacks switches 74 and 76. The last section lacks switch 75. By setting the positions of the switches, various two-dimensional configurations of LEDs can be obtained. FIG. 2(*b*) illustrates the switch positions used to obtain six LEDs in series. Similarly, FIG. 2(*c*) illustrates the switch positions that provide two sets of three LEDs in series that are connected in parallel to the power terminals. FIG. 2(*d*) illustrates the switch positions that provide three sets of LEDs in which each set has two LEDs in series, and the three sets are connected in parallel across the power terminals. Finally, FIG. 2(*e*) illustrates the switch positions that provide six LEDs in parallel across the power terminals.

It should be noted that each of the LEDs shown in FIG. 2(*a*) could be replaced by an array of LEDs having a similar structure. The resultant LED array is one example of a nested array of LEDs. For the purposes of the present discussion, a nested array of LEDs is defined to be an array of LEDs that has a plurality of ordered levels including a first layer, which is the innermost layer, a last layer which is the outer layer, and optionally one or more intermediate layers and an outer layer. Each layer has a plurality of conductors, one or more "sockets" and a plurality of switches that connect the contents of the sockets in that layer to selected ones of the conductors in that layer. The conductors in a layer include connection conductors that can be used to connect that layer of a socket in higher order layers. In the first layer, the sockets are connected to LEDs. In the remaining layers, the sockets are connected to connection conductors in an adjacent layer.

Figure 3:
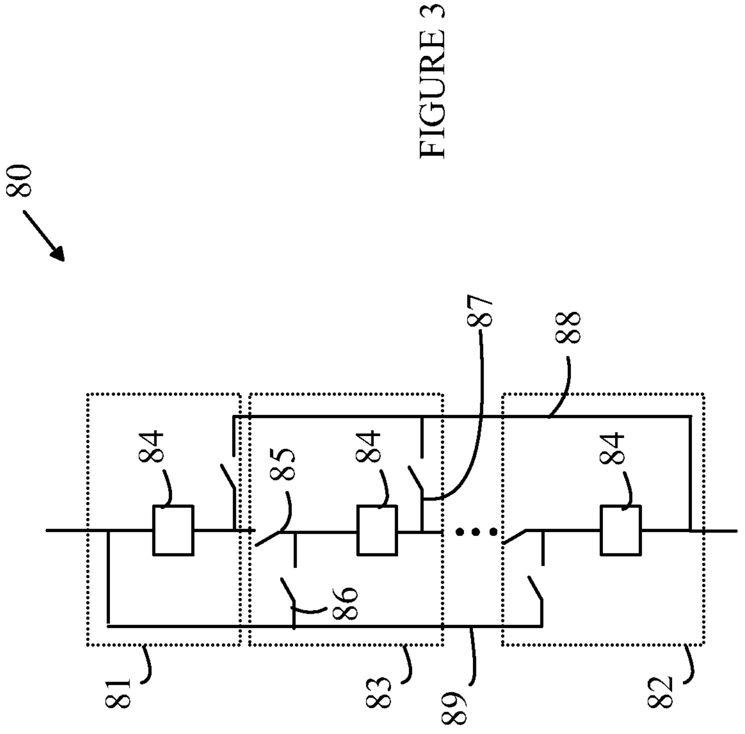
FIG. 3 illustrates the basic connection arrangement utilized in a nested two-dimensional array.

Refer now to FIG. 3, which illustrates the basic connection arrangement utilized in a nested two-dimensional array. Array 80 is constructed from a plurality of sections including a first section 81, a last section 82, and optionally, a number of intermediate sections 83. Refer first to intermediate section 83. Intermediate section 83 includes a light source 84 and three switches 85-87. Switch 86 connects the anode of light source 84 to power rail 89; switch 87 connects the cathode of light source 84 to power rail 88, and switch 85 connects the anode of light source 84 to the cathode of the light source in the adjacent stage. Section 81 differs from section 83 in that switches 85 and 86 are omitted. Similarly, section 82 differs from section 83 in that switch 87 is omitted.

Figure 4:
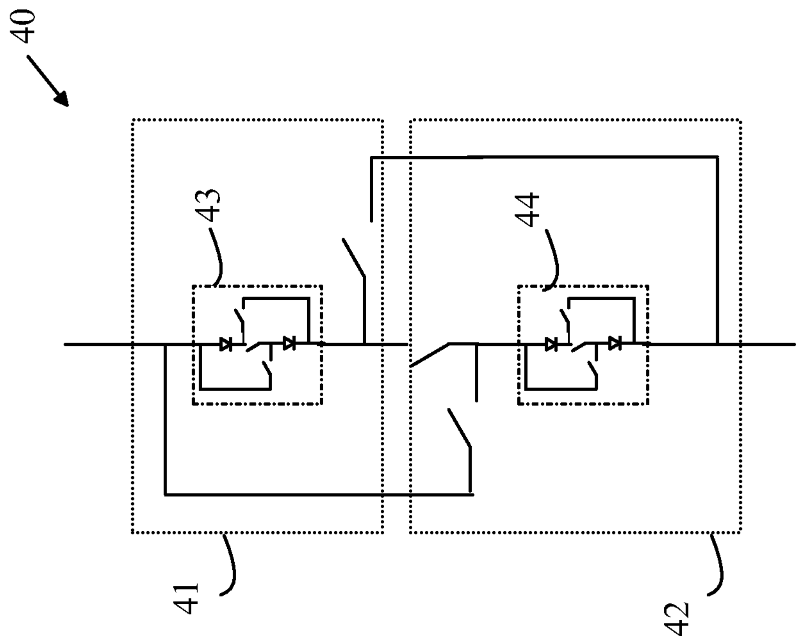
FIG. 4 illustrates one embodiment of a nested array of LEDs.

Refer now to FIG. 4, which illustrates one embodiment of a nested array of LEDs. Array 40 is constructed from two sections shown at 41 and 42. The light sources in each of these sections are constructed from a similar sub-array having two LEDs in each section, the sub-array corresponding to section 41 is shown at 43, and the sub-array corresponding to section 42 is shown at 44. By setting the relevant switches, array 40 can be configured as four LEDs in parallel, four LEDs in series, or two sets of two LEDs in which each set has two LEDs in series. Thus, array 40 can be used to implement a light source with $V_{min}=V_f$, $2V_f$, or $4V_f$.

Figure 5:
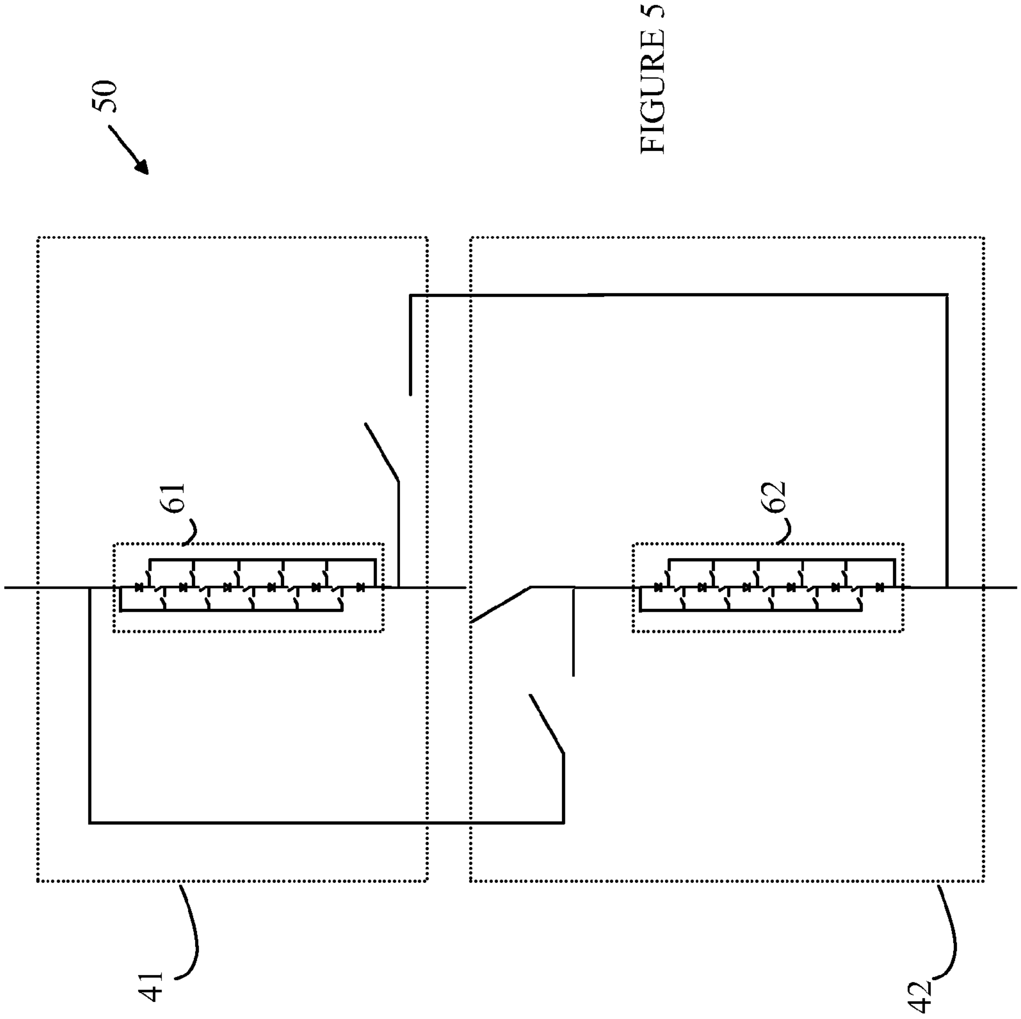
FIG. 5 illustrates a light source according to another embodiment of the present invention in which the inner switching topology is different from the outer switching topology.

The simple case shown in FIG. 4 uses the same switching topology for the inner sections as the outer sections. However, it is to be understood that the inner switching topology could be different than the outer switching topology. Refer now to FIG. 5, which illustrates a light source according to another embodiment of the present invention in which the inner switching topology is different from the outer switching topology. Light source 50 is similar to light source 40 discussed above in that light source 50 is constructed from two switching sections 61 and 62 at the outer layer of the nesting. Light source 50, however, utilizes inner sub-arrays that are constructed from six LEDs in a topology similar to that discussed above with reference to FIGS. 2(*a*)-2(*e*). Hence, light source 50 provides a 12-LED light source which can be configured with $V_{min}=12V_f$, $9V_f$, $8V_f$, $6V_f$, $5V_f$, $4V_f$, $3V_f$, $2V_f$, or $V_f$.

The above-described light sources utilize a plurality of LEDs and a switching array. The material and fabrication systems in which LEDs are constructed are typically different from the material systems in which switching circuitry is constructed. In one aspect of the present invention, the switching array is fabricated on a separate substrate, referred to as the switching substrate in the following discussion. The LEDs are then bonded to this substrate by connecting the anode and cathode of each LED to corresponding pads on the surface of the switching substrate.

Figure 6:
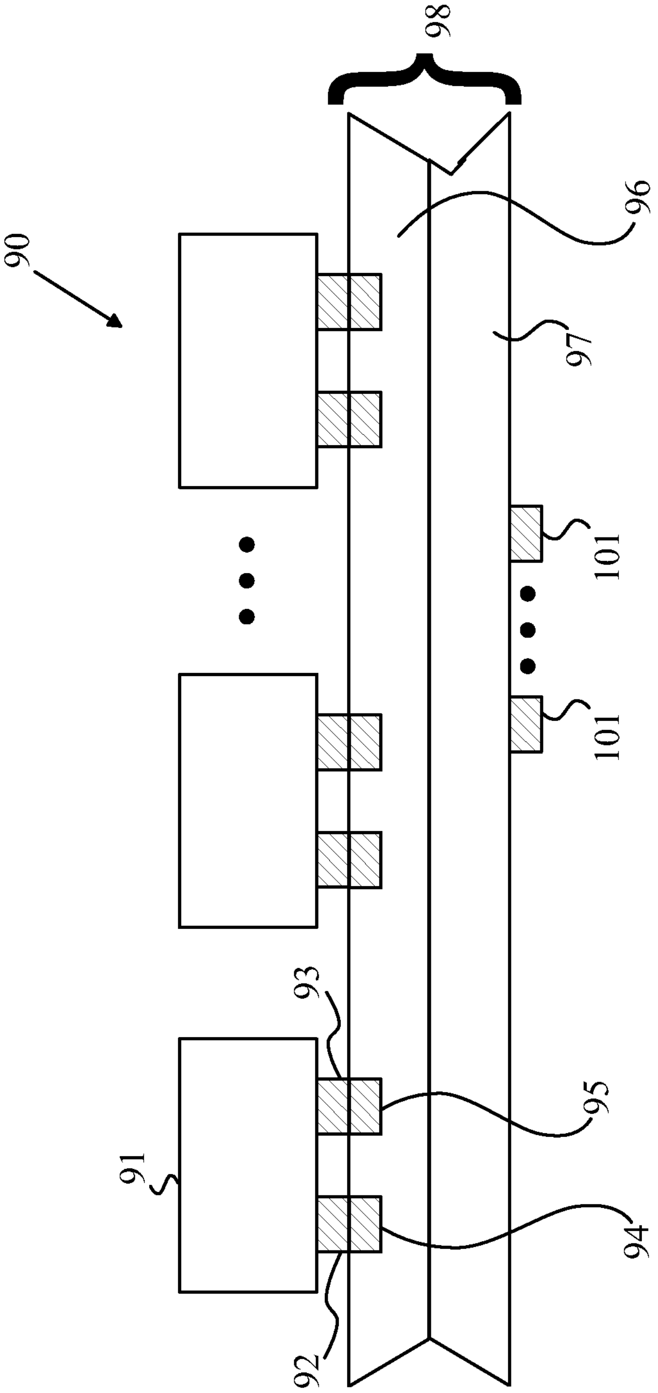
FIG. 6 is a cross-sectional view of a section of an LED light source according to one embodiment of the present invention.

Refer now to FIG. 6, which is a cross-sectional view of a section of an LED light source according to one embodiment of the present invention. Light source 90 includes a plurality of LEDs 91 that emit light upwards through the LED dies.

Each die is powered by first and second contacts shown at 92 and 93, respectively. The contacts are bonded to corresponding pads, shown at 94 and 95, on switching substrate 98. In one aspect of the present invention, switching substrate 98 is divided into two layers. The first layer is a wiring layer 96, and the second layer is a circuit layer 97 that includes the active switches of the switching array. For the purposes of the present discussion, an "active switch" is a switch whose state can be changed during the actual operation of the light source in response to signals from a controller. As will be explained in detail below, the wiring substrate can include switches that are set once during the initial configuration of the light source.

To simplify the drawing, the switching elements and the corresponding connections to the contacts that power the LEDs have been omitted from the drawings. In one aspect of the invention, switching substrate 98 also includes a plurality of connection pads 101 that are used to transmit signals and power to the switching array, which, in turn, powers the LEDs and configures the LED array in the desired manner. The switching substrate can also include other components such as the controller discussed above. These additional components will be discussed in more detail below.

Given the desired number of LEDs in a light source, the switches in a two-dimensional array according to the present invention can be set to provide any of a plurality of driving voltages. For each driving voltage all of the LEDs generate light, and hence, only one type of package is required for a given number of LEDs in the light source, as that package can be configured to provide the desired driving voltage for different light sources having that number of LEDs.

Figure 7B:
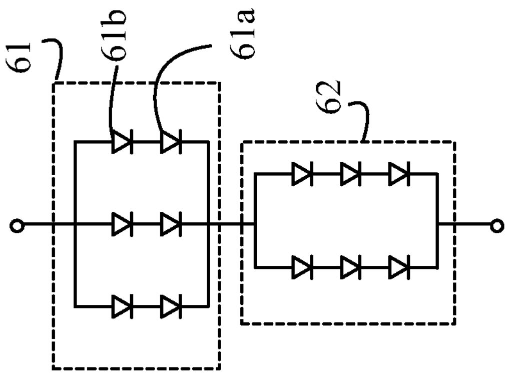
FIGS. 7*a* and 7*b* illustrate two configurations that can be obtained using the light source shown in FIG. 5.
Figure 7A:
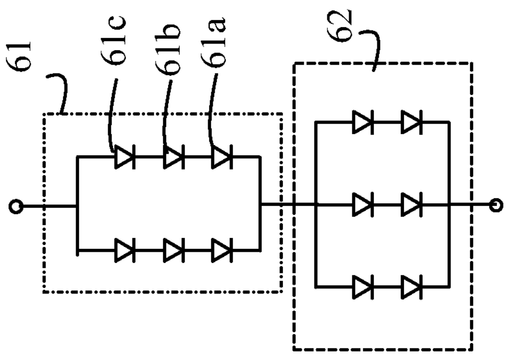

If the number of LEDs in the light source is sufficiently large, there are a number of configurations that provide the same driving voltage. Refer now to FIGS. 7*a* and 7*b*, which illustrate two configurations that can be obtained using the light source shown in FIG. 5. Each configuration has $V_{min}=5V_f$. Consider the case in which LED 61*a* is defective because the LED has formed an open circuit between its anode and cathode. Any LED that is in series with LED 61*a* will be rendered inoperative by the open circuit. In the configuration shown in FIG. 7(*a*), two operative LEDs are lost, namely LEDs 61*b* and 61*c*. Hence, the light output of the light source is reduced by 25 percent. If the light source is reconfigured as shown in FIG. 7(*b*), only LED 61*b* is lost in addition to the defective light source. In this case, the loss of light is reduced to about 15 percent. Hence, if such a fault is detected, the light source can be reconfigured to reduce the losses resulting from the defect. Such reconfiguration is particularly advantageous in applications in which the cost of changing the light source is large, as the lifetime of the light source is effectively extended by this reconfiguration.

In another aspect of the present invention, a large LED array that can be divided into a number of smaller LED arrays that can be separately configured is utilized. This type of LED array will be referred to as a master array in the following discussion. A master array may include hundreds or thousands of LEDs. A manufacturer need only stock one type of master array. When a particular LED array having a smaller number of LEDs than the master array is required, the master array is cut into the smaller array, which, in turn, is configured for the desired driving voltage.

Figure 8:
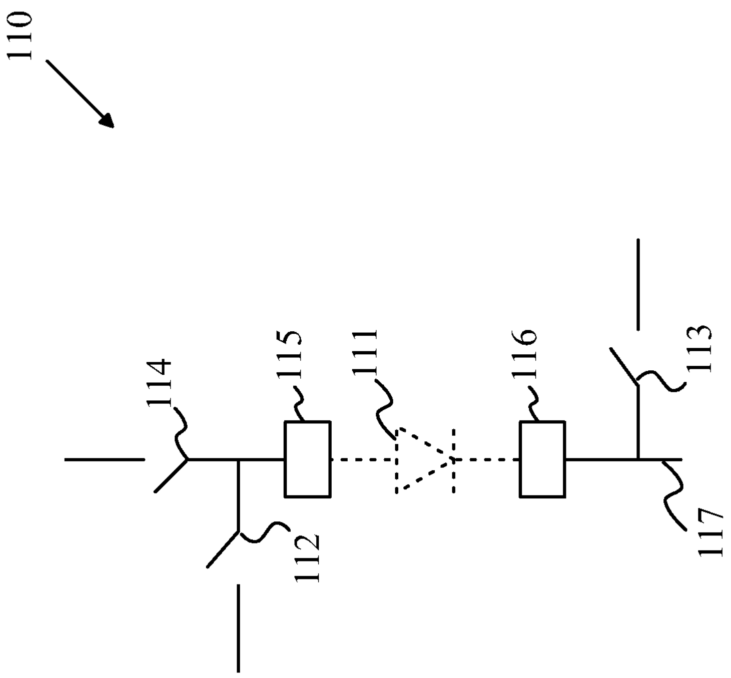
FIG. 8 is a bottom view of one of these switching modules that is constructed in a switching substrate.

In one aspect of the invention, the switching substrate in the master array is configured to provide a plurality of LED switching modules. Refer now to FIG. 8, which is a bottom view of one of these switching modules that is constructed in a switching substrate. Switching module 110 includes pads 115 and 116 that are used to connect an LED 111 shown in phantom. Pad 115 is connected to switches 112 and 114 that are part of the switching substrate. Pad 116 is connected to switch 113 and terminal 117 that are also part of the switching substrate. The switching module can be viewed as a four-terminal network having an anode terminal, a cathode terminal, and first and second power terminals. The nested LED arrays discussed above can be constructed from such switching modules.

Figure 9:
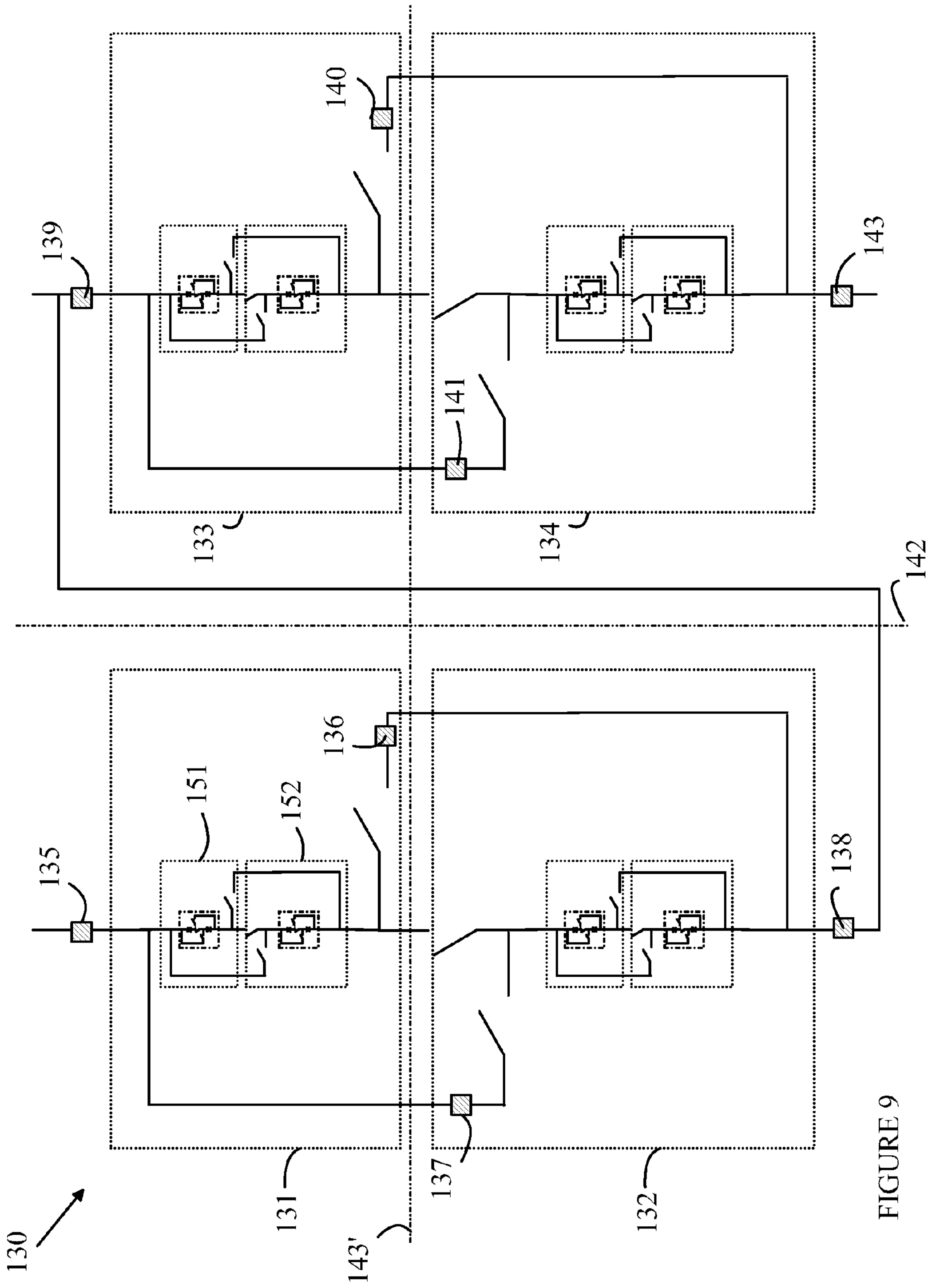
FIG. 9 is a top view of a portion of a master array according to one embodiment of the present invention.

Refer now to FIG. 9, which is a top view of a portion of a master array according to one embodiment of the present invention. Master array 130 is constructed by nesting light sources in a manner analogous to that described above with reference to FIGS. 4 and 5. Master array 130 can be viewed as having four sub-array sources shown at 131-134. Each sub-array source has four LEDs. Each sub-array, in turn, is constructed by nesting two LED sub-arrays such as sub-arrays 151 and 152. It should be noted that sub-arrays 151 and 152 are substantially the same as the light sources shown in FIG. 4.

Master array 130 could be used as a single light source by providing power between contacts 135 and 143. Such a light source has 16 LEDs and can be configured to provide a plurality of different driving voltages and configurations by setting the various switches within the array. For example, master array 130 could be configured to provide 16 LEDs in series which can be driven by a voltage source having a driving voltage between $16*V_f$ and $16*V_d$.

In another arrangement, master array 130 could be configured as two strings of eight LEDs. The individual strings would have eight LEDs connected in series. The two strings would be driven in parallel, and could be driven from a source having a driving voltage between $8*V_f$ and $8*V_d$. In yet another arrangement, master array 130 could be configured as four strings with four LEDs in each string. The LEDs within a given string would be connected in series and the strings would be connected in parallel.

Master array 130 can also be physically divided into arrays having smaller numbers of LEDs. For example, if master array 130 is cut along lines 143' and 142, four individual arrays that can be used as separate light sources are obtained. Sub-array 131 can be powered by applying the appropriate voltage between contacts 135 and 136. Similarly, sub-array 132 would be powered by connecting contacts 137 and 138 to the appropriate power source; sub-array 133 would be powered by connecting power to contacts 139 and 140, and sub-array 134 would be powered by connecting power to contacts 141 and 143. Each sub-array includes four LEDs that are configured as four LEDs in series, two strings of two LEDs in series with the two strings connected in parallel, or four LEDs connected in parallel.

If master array 130 is divided only along one of lines 142 and 143, two 8-LED light sources are generated. Similarly, master array 130 could be divided such that sub-arrays 131-133 are in a first light source having 12 LEDs and sub-array 134 is in a separated light source having four LEDs.

While the embodiment shown in FIG. 9 has only a few sub-arrays, it is to be understood that master arrays having hundreds of sub-arrays that can be separated into light sources of different sizes and configurations could also be constructed. Hence, a light source manufacturer can generate and stock one type of large master array, which can then be divided into specific light sources of different sizes as the manufacturer receives orders. This substantially reduces the inventory and assembly costs associated with the manufacture of LED light sources.

It should also be noted that the master array 130 discussed above could be further divided into smaller light sources by cutting the array between sub-arrays 151 and 152 in a manner analogous to that described above. In addition, the nested sub-arrays can have different topologies as discussed above with reference to FIG. 5. Hence, master arrays that can be divided into a large number of different light sources having varying numbers of LEDs can be constructed using the teachings of the present invention.

The above-described embodiments of the present invention utilize a switching array to provide the connections to the LED dies. Each of the switches in the switching array must be able to hold off the maximum driving voltage on the array if all possible configurations are to be achieved. While switches that operate at voltages of the order of 20V are utilized in driving LCD displays, switches that can withstand higher voltages or which must be constructed in conventional CMOS present challenges.

In some applications, the switches need only be set once. For example, if a fixed array is to be generated by dividing a master array and then setting the configuration once before the light source is packaged, the switches are only utilized to set the configuration. In these cases, the switches can be implemented as breakable or connectable links in conducting lines deposited on an appropriate substrate, and hence, the challenges associated with high voltage semiconductor switches are avoided.

Figure 10:
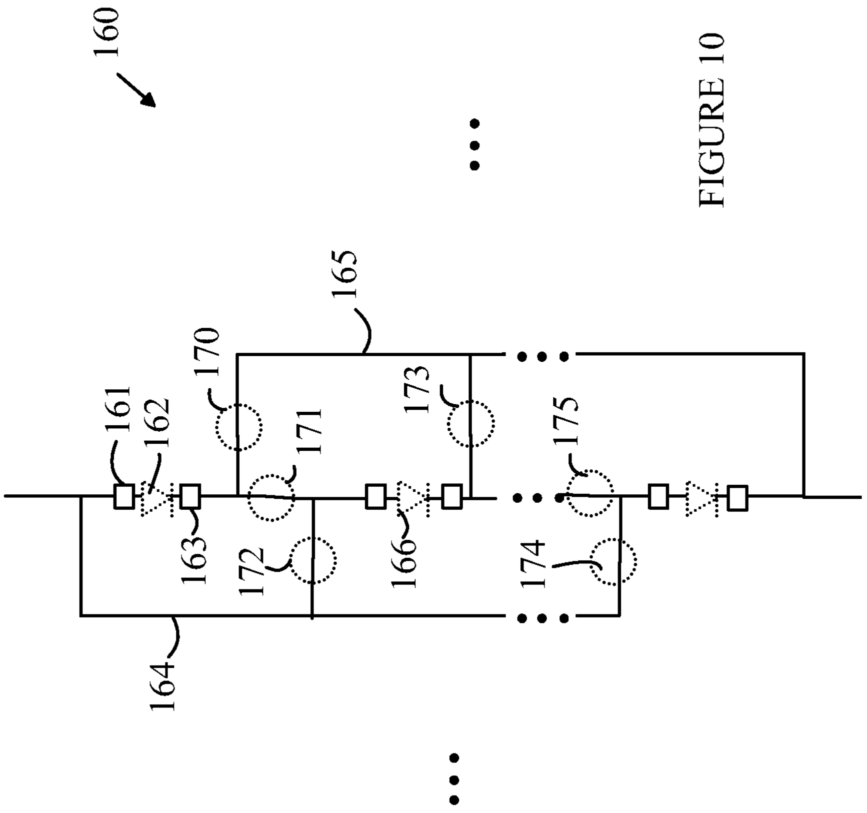
FIG. 10 is a bottom view of a wiring layer in a switching substrate showing a portion of a master array prior to the portion in question being configured by setting the switches.

Refer now to FIG. 10, which is a bottom view of a wiring layer in a switching substrate showing a portion of a master array prior to the portion in question being configured by setting the switches. The portion shown at 160 is similar to the configuration shown in FIG. 2(*a*). The LEDs are mounted on the top surface of the wiring layer and connected to traces on the bottom surface by conducting vias. The traces are implemented on an insulated region of the bottom surface. A typical LED is shown in phantom at 162 and is connected between vias 161 and 163. The traces on the bottom surface of the switching substrate include the power buses shown at 164 and 165 that provide power to the LED in this portion of the master array. Selected regions in the traces are used to implement the "switches" discussed above. Exemplary switch regions are labeled at 170-175. In this embodiment of the master array, all of the switches are initially closed. The array, or a sub-array thereof, is configured by removing selected ones of the traces in the switch regions. For example, if LED 162 is to be connected directly across the power buses, region 171 would be removed. Alternatively, if LED 162 were to be connected in series with LED 166, regions 170 and 172 would be removed.

The portions of the traces that are to be removed can be removed by any method that does not damage the LEDs or other circuitry that is already connected to the wiring layer. In one aspect of the invention, the trace regions are removed by laser ablation. In another aspect of the invention, the trace regions are removed by a lithographic etching procedure in which the back surface is masked with photoresist in those regions that are not to be removed.

Figure 11B:
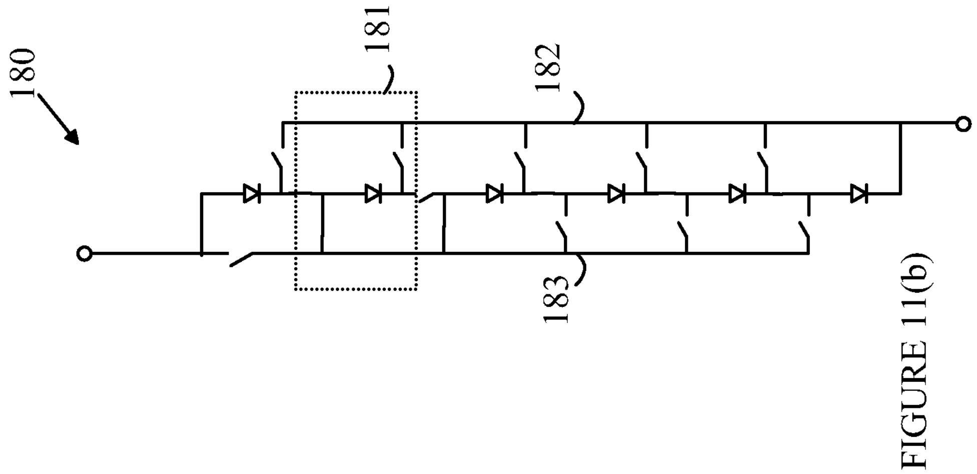
FIGS. 11 (*a*)-11(*b*) illustrate another embodiment of an LED according to the present invention.
Figure 11A:
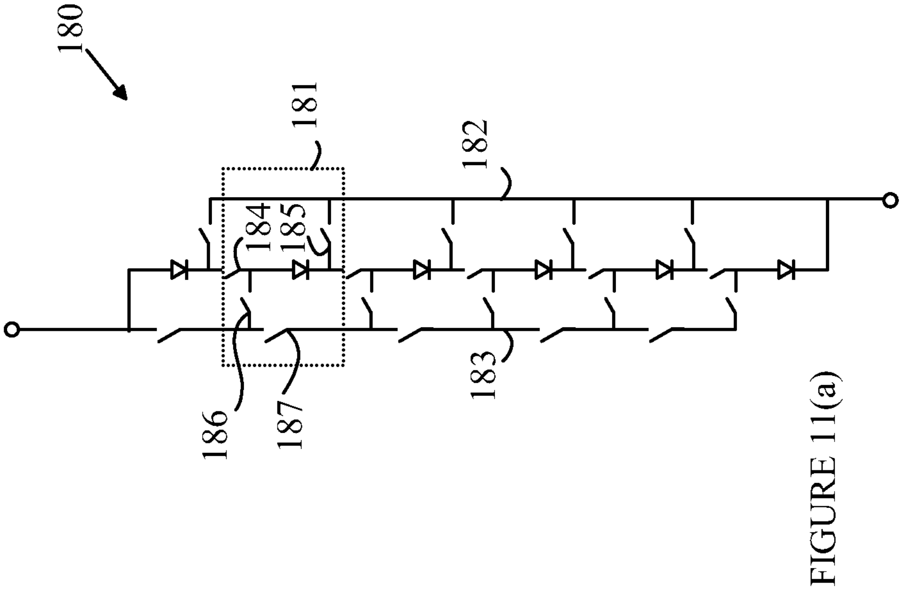

By providing additional switches, defective LEDs can be removed from the array after the array has been assembled. Refer now to FIGS. 11(*a*)-11(*b*), which illustrate another embodiment of an LED according to the present invention. Array 180 differs from the array described above with reference to FIG. 2(*a*) in that additional switches are added to the LED stages. Each intermediate LED stage such as LED stage 181 includes four switches. Switch 184 allows the LED to be connected in series with the LED in the stage above stage 181. Switches 185 and 186 allow the LED in that stage to be connected to the power buses 182 and 183, respectively. Switch 187 is used to interrupt power rail 183 at a location opposite the LED. Consider the case in which the LED in stage 181 is defective and forms an open circuit. If the LEDs in the array are to be connected in series, this open circuit would prevent the configuration in question. However, if the switches are operated in the pattern shown in FIG. 11(*b*), the LED in section 181 is effectively removed from the array while allowing the remaining LEDs to be connected in series. It should be noted that if an LED fails by forming a short, the remaining LEDs can be connected in series by leaving the switches that interrupt the power bus in the closed position.

Consider an arrangement in which there is one additional LED stage in the array. If the LEDs are all functioning, the spare LED can be bypassed using the LEDs in the power bus. If one of the LEDs is found to be open after the light source is fabricated, the spare LED can be introduced into the series string and the defective LED effectively cut out of the array.

The above-described embodiments of the wiring layer included switches that were initially all closed. At configuration, the switches that were to be opened were opened by removing metal from the corresponding portion of one of the conductive traces in the wiring layer. However, embodiments in which the switches are initially open and configured by providing conductive bridges at configuration can also be constructed. Such embodiments have a number of advantages that will be discussed in detail below.

Figure 12:
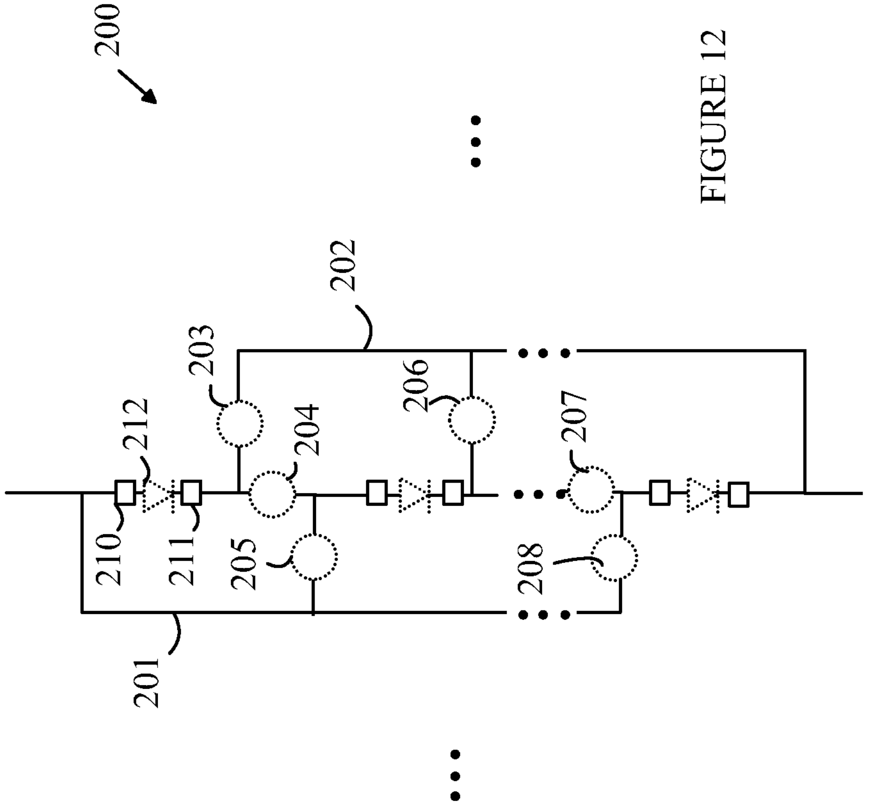
FIG. 12 is a bottom view of a portion of a switching substrate having initially open switches.

Refer to FIG. 12, which is a bottom view of a portion of a switching substrate having initially open switches. Array 200 is organized in a manner analogous to that described above with respect to FIG. 10. The LEDs are connected between power buses 201 and 202 and each other via switches 203-208. However, the various switches shown at 203-208 are initially open circuits thereby isolating each of the LEDs from the other LEDs in the array. One advantage of the initially open configuration is that the individual LEDs can be tested by providing power between the contacts used to connect the LEDs to the conductors that are exposed on the bottom surface of the switching substrate. For example, LED 212 can be tested by using a pair of probes to contact contacts 210 and 211 that are exposed on the bottom surface of the switching substrate. It should be noted that all of the LEDs can be powered at once using a probe card that provides contacts to each pair of LEDs. The light generated by each LED can then be measured by a photodetector if the LEDs are tested one at a time or by a camera that views the front side of the switching substrate if all of the LEDs are powered at once.

Figure 13:
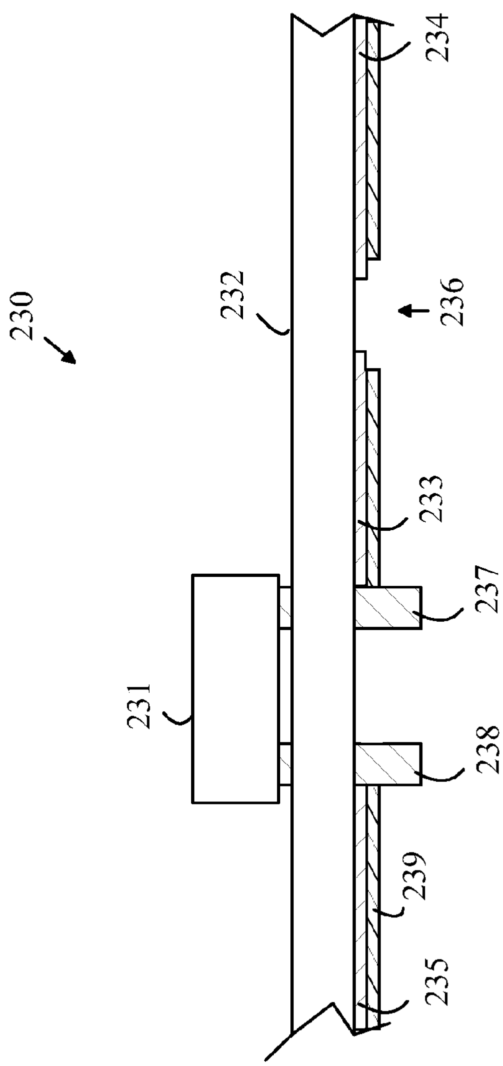
FIG. 13 is a cross-sectional view of a portion of an LED array according to one embodiment of the present invention in which the switches are initially configured as open switches.

Refer now to FIG. 13, which is a cross-sectional view of a portion of an LED array according to one embodiment of the present invention in which the switches are initially configured as open switches. Array 230 includes a plurality of LEDs such as LED 231 that are mounted on the top surface of a wiring layer 232 by connecting the power contact of the LED to power terminals 237 and 238 that pass through substrate 232 and are exposed on the bottom surface of the array. The bottom surface of wiring layer 232 includes a plurality of metallic traces of which traces 233-235 are exemplary. Trace 235 connects to terminal 238, and trace 233 connects to terminal 237. Trace 233 is separated from trace 234 by a gap 236 to form an open "switch". A layer 239 of insulating photoresist or similar material can be provided over the metallic traces in regions other than those corresponding to the switches. The array is configured by filling the gaps with conductors in those switches that are to be configured as "closed" in the array.

Figure 14:
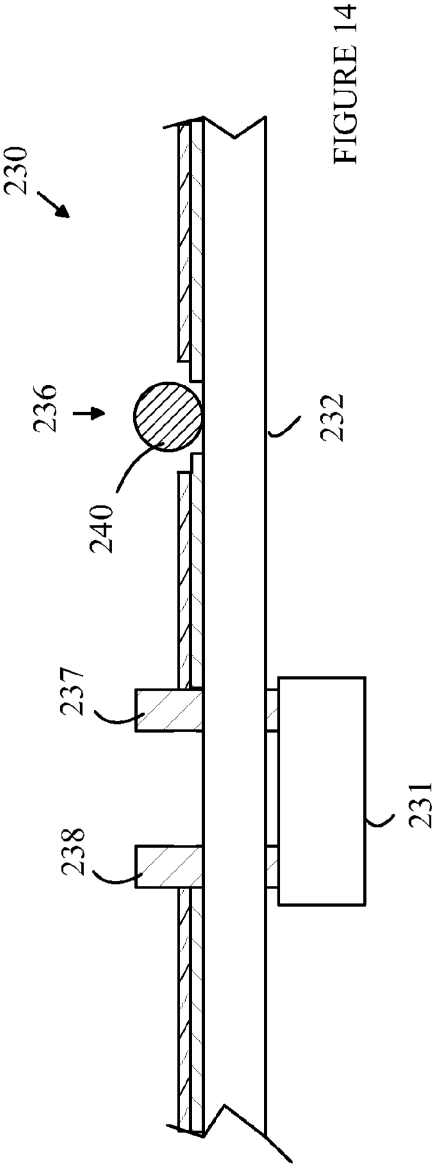
FIG. 14 is a cross-sectional view of the portion of the LED array.

In one aspect of the invention, the gaps are filled by selectively depositing a conducting material in the gaps corresponding to switches that are to be closed. Refer now to FIG. 14, which is a cross-sectional view of the portion of the LED array shown in FIG. 13 illustrating the filling of the gaps.

During the filling process, the wiring layer is inverted such that the gaps are facing upwards. In this embodiment, a solder ball 240 is placed in each of the gaps that is to be filled. The wiring layer is then heated to allow the solder to flow and fill the gap. In another embodiment, a droplet of a conducting epoxy or other such material is placed in the gap and cured. In still a further embodiment, a layer of metal such as copper is selectively deposited in the gap.

In some applications, switches that are operated more than once are needed. Such switches that could be utilized during the normal operation of the light source or during a testing phase are advantageous. In particular, applications in which the driving voltage for the light source changes over time or applications in which the light source is to be reconfigured to compensate for an LED that fails during the lifetime of the light source would benefit from such switching arrays.

The first class of applications includes applications in which the array is driven from an AC power source, and hence, must alter its configurations as the driving voltage changes over the power cycle. One example of an AC LED light source that can be implemented using the switching arrays of the current invention is disclosed in co-pending patent application Ser. No. 13/084,336 filed on Apr. 11, 2011, which is hereby incorporated in its entirety by reference. The two-dimensional light sources described therein are characterized by a minimum driving voltage, $V_{min}$, and a maximum driving voltage, $V_{max}$. $V_{min}$ is set by the number of LEDs that are connected in series, $V_{min}=N_s*V_f$, and $V_{max}=N_s*V_d$, where $N_s$ is the number of LEDs that are in series within the light source.

A self-repairing light source is based on the observation that a plurality of configurations can be provided that are driven by the same driving potential. In principle, an LED can fail because the LED forms a short between the anode and cathode, or because the LED becomes an open circuit between the anode and cathode. If an LED fails because it forms an open circuit, the light source will continue to function if the LED in question is in parallel with at least one other LED that is functioning or if the LED is effectively replaced using the switching scheme discussed above with reference to FIGS. 11(*a*)-11(*b*). In this case, the light from the light source may be reduced at most by the amount of light that was generated by the failed LED and any LEDs that were in series with that LED prior to failure. As noted above, configurations that reduce the number of good LEDs that are removed from service by the defective LED can be utilized to reduce the light loss. It should also be noted that the current that flowed through the now failed LED will be re-directed through the LED(s) that are in parallel with that LED, and hence, those LED(s) will generated additional light. This additional light partially compensates for the lost light from the failed LED. In the case of the arrangement shown in FIGS. 11(*a*)-11(*b*), the light output will remain the same.

If an LED forms a short between the anode and cathode, the light source will continue to function if that LED is in series with other LEDs provided the resultant driving voltage is still less than $V_{max}$. Refer again to FIG. 2(*a*). An alternative method for dealing with a shorted LED is to "cut" the LED out of the light source by opening the switches associated with that LED. For example, if LED 76 were to become a short circuit, switches 74, 75, and 77 could be opened, thereby isolating LED 76. If the other LEDs in the array are configured to operate without LED 76, the light source will continue to function. For example, the remaining LEDs could be configured as a string of four LEDs in series by also isolating LED 76. An alternative arrangement would be to convert the string of five LEDs in parallel and put this string in series with another string such that the driving voltage is within the correct range.

The above repair mechanism assumes that an LED is inoperative after the LED has been attached to the switching substrate. Hence, some mechanism for testing the LEDs after the LEDs are mounted on the switching substrate is needed. In the case of arrays that are constructed from switches that can be operated repeatedly, each LED can be tested by selecting a configuration in which that LED is connected in parallel between the power buses and the other LEDs are disconnected from the power bus. The LEDs can then be driven with different currents or voltages by connecting the power buses to a suitable power source and observing the light that is generated by the LED under test as well as the current that is drawn by that LED. As noted above, in implementations in which the wiring layer initially has open switches, the individual LEDs can also be tested.

In embodiments that require active switches, an active switching layer that includes high voltage switches is included in the switching substrate. In one aspect of the invention, the LEDs are mounted directly on the active switching layer. In another aspect of the invention, the LEDs are mounted on the initially open switch wiring layer discussed above and that wiring layer is, in turn, mounted on an active switching layer. In either case, the layout of the switching layer is substantially the same as that of the wiring layer discussed above. Refer again to FIG. 12. The switching layer corresponding to array 200 includes pads such as pads 210 and 211 that connect to the LEDs. The switching layer would include conductors such as those shown in FIG. 12. Transistors would occupy the areas that were left open for the switches shown at 203-207. It should be noted that the conductors and transistors could be constructed in the top surface of the switching layer, and hence, vias that extend through the switching layer are not needed to connect the LEDs to the connection pads. The switching layer can also be used to construct a master array as described above.

Refer again to FIG. 8. In principle, switching module 110 shown in FIG. 8 has eight states that are determined by the states of the three switches included in the switching module. However, in practice, only two of these states are used when the switching module is in the interior of a string of switching modules. In the first state, LED 111 is connected between the anode terminal and cathode terminal and disconnected from the power terminals by closing switch 114 and opening switches 112 and 113. This state is used to connect the LED in series with another LED or switching module that is adjacent to the switching module in question. This state will be referred to as the series connected state in the following discussion. In the second state, the LED is connected between the first and second power terminals by closing switches 112 and 113 and opening switch 114. This state is used to connect the LED in parallel with an adjacent LED or switching module, and hence, will be referred to as the parallel connected state. Accordingly, a single control line can be utilized to control the state of a switching module, the module being placed in the series connected state if the line is high and in the parallel connected state if the line is low or vice versa. In a module that is the first module in a series connected string of modules, switch 114 is always closed, and hence, this switch can be replaced by a conductor. Similarly, in a module that is the last module in a series connected string of modules, switch 113 is always closed. Accordingly, only one control conductor is needed for each LED module.

Figure 15:
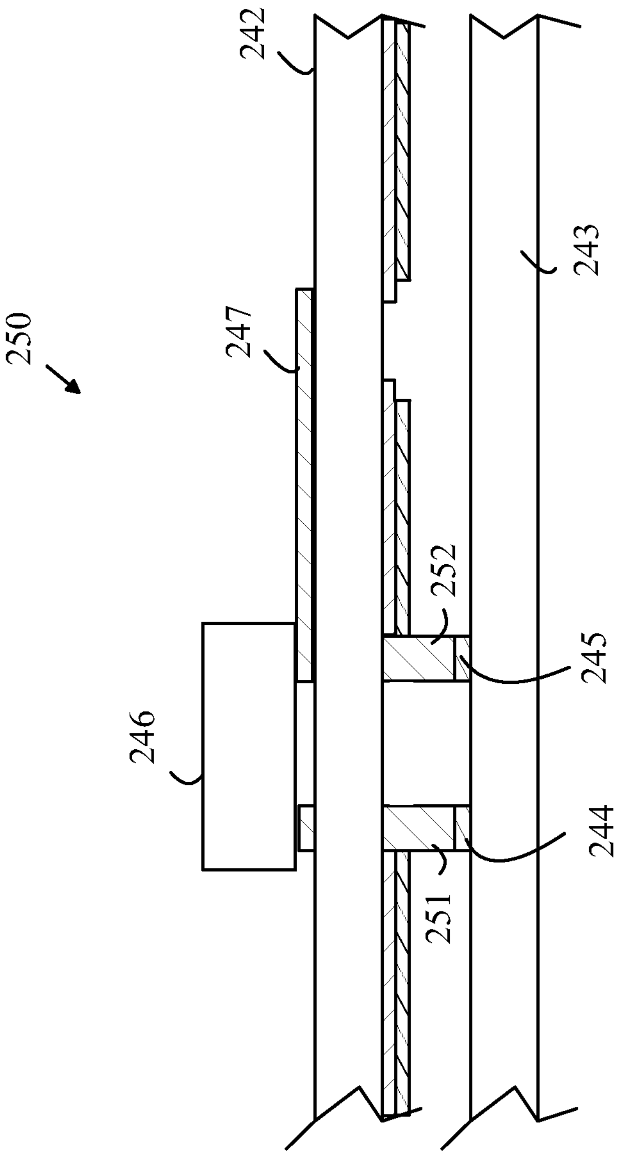
FIG. 15 is a cross-sectional view of a portion of a light source constructed by bonding a wiring layer containing the LEDs to a switching layer to provide a switching substrate.

If the active switching layer is utilized, a wiring layer is not required, as the wiring between the switches can be included in the metal layers of the switching layer. However, there are advantages to utilizing a separate wiring layer in which the switches are initially open. Refer now to FIG. 15, which is a cross-sectional view of a portion of a light source constructed by bonding a wiring layer containing the LEDs to a switching layer to provide a switching substrate. Light source 250 is constructed from a plurality of LEDs of which LED 246 is exemplary. LED 246 is mounted on wiring layer 242 on pads that are electrically connected to pads 251 and 252 on the bottom surface of wiring layer 242. These pads are bonded to pads 244 and 245 on the top surface of the active switching layer 243. Since the switches on wiring layer 242 are in the open state, the switches on wiring layer 242 have no electrical effect on the light source. The state of the switches in active switching layer 243 determines the configuration of the array of LEDs. Furthermore, since active switching layer 243 has a topological configuration that matches that of wiring layer 242, the combination of the two layers can provide a master array of the type discussed above.

One advantage of utilizing the wiring layer is that the array of LEDs on the wiring layer can be tested prior to mounting on the active switching layer, and hence, any defects in the array are known in advance. In addition, the manufacturer need only stock one type of wiring array with attached LEDs. For applications in which the active switching layer is required, the wiring layer array is merely bonded to the switching array. Finally, the surface of the wiring layer can include heat dissipating structures that are formed by extending one or both of the electrodes to which the LED die is attached. In the example shown in FIG. 15, contact 247 is such a structure. In this example, wiring layer 242 is constructed from an insulator. The extended metal surface provides a heat path that moves heat from LED 246 to the surrounding air. If the density of the LEDs on the surface of wiring substrate 242 is adjusted with respect to the power generated by each LED, this path can provide the necessary cooling for the LEDs.

The above-described embodiments utilize single LED dies that are mounted on the wiring layer or active switching layer. However, embodiments in which multi-LED dies or entire wafers are mounted on the wiring layer or active switching layer can also be constructed. Wafer scale packaging has the potential for substantially reducing the packaging costs if the problems associated with defective dies on a wafer can be overcome. Since the present invention can provide configurations that reduce the problems associated with inoperative LEDs in the dies, the problems of defective dies on a wafer are substantially reduced.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:

a plurality of LEDs; and a switching substrate coupled to LEDs, said switching substrate comprising a plurality of switches, said switching substrate providing a plurality of configurations for said plurality of LEDs, each configuration being characterized by a two-dimensional array of LEDs having a minimum bias potential and a maximum bias potential, said LED array generating light when a bias potential is provided between first and second power terminals that is greater than said minimum bias potential, at least two of said configurations being operable to provide light at the same bias potential, said switching substrate being sub-dividable into a plurality of identical multi-LED light sources by dividing said switching substrate along predetermined lines.

2. The apparatus of claim 1 wherein said switching substrate comprises a wiring layer having a plurality of conducting traces on an insulating substrate, said LEDs being electrically connected to corresponding ones of said conducting traces, said conducting traces comprising a plurality of switching regions that provide said switches.

3. The apparatus of claim 2 wherein said switching regions are breaks in said conducting traces that are positioned to allow said breaks to be bridged by a conducting material.

4. The apparatus of claim 2 wherein said switching regions are regions of said conducting traces that are positioned to allow said conducting traces to be removed in said regions.

5. The apparatus of claim 2 wherein said wiring layer has a top surface and a bottom surface and wherein said LEDs are mounted on said top surface and said conducting traces are located on said bottom surface, said LEDs being connected to said conducting traces by conductors that pass through said wiring layer.

6. The apparatus of claim 1 wherein said switching substrate comprises an active switching layer having a plurality of transistors therein and conducting traces that connect to said LEDs.

7. The apparatus of claim 1 wherein said two-dimensional array of LEDs is a nested array of LEDs.

8. The apparatus of claim 7 wherein the first level of said nested array comprises:

first and second power terminals; and a plurality of sections connected in series, including a first section, a last section, each section comprising an LED, said first section comprising first and second switches, said first switch connecting a first terminal of said LED in that section to said first power rail, said second switch connecting a second terminal of said LED to said second power rail, said last section comprises first and second switches, said first switch connecting one terminal of said LED to said first power rail and said second switch connecting said first terminal of said LED to a second terminal of an LED in an adjacent section.

9. The apparatus of claim 8 wherein said first level of said nested array further comprises one or more intermediate sections, each intermediate section comprising an LED and a plurality of switches, said intermediate sections comprising first, second, and third switches, said first switch connecting a first terminal of said LED in that section to said first power terminal, said second switch connecting a second terminal of said LED to said second power terminal, and said third switch interrupting a serial connection between said LED and an LED in an adjacent section.

10. The apparatus of claim 9 in which one of said intermediate sections comprises a fourth switch that allows one of said LEDs in a series connected string of said LEDs to be bypassed if that LED is inoperative because of an open circuit in said LED.

* * * * *